United States Patent
Brunner (10) Patent No.: US 7,196,577 B2
(45) Date of Patent: Mar. 27, 2007

(54) AMPLIFIER WITH CAPACITOR SELECTION

(75) Inventor: Eberhard Brunner, Portland, OR (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/854,658

(22) Filed: May 25, 2004

(65) Prior Publication Data
US 2005/0077958 A1    Apr. 14, 2005

Related U.S. Application Data

(60) Provisional application No. 60/511,208, filed on Oct. 14, 2003.

(51) Int. Cl.
*H03F 1/36* (2006.01)
*H03F 1/14* (2006.01)
*H03F 3/45* (2006.01)

(52) U.S. Cl. .................. 330/86; 330/51; 330/254; 330/282; 330/284

(58) Field of Classification Search ............... 330/86, 330/254, 85, 279, 260, 284, 282
See application file for complete search history.

(56) References Cited

U.S. PATENT DOCUMENTS

| 4,255,715 | A | * | 3/1981 | Cooperman | 330/9 |
|---|---|---|---|---|---|
| 4,430,622 | A | * | 2/1984 | Simoes | 330/9 |
| 4,577,159 | A | * | 3/1986 | Pace | 330/9 |
| 4,585,956 | A | * | 4/1986 | Lie | 327/95 |
| 5,077,541 | A |   | 12/1991 | Gilbert | 330/284 |
| 5,446,405 | A | * | 8/1995 | Ikeda | 330/9 |
| 5,684,431 | A |   | 11/1997 | Gilbert et al. | 330/254 |
| 5,872,470 | A | * | 2/1999 | Mallinson et al. | 327/94 |
| 5,990,748 | A | * | 11/1999 | Tomasini et al. | 330/292 |
| 6,489,849 | B1 |  | 12/2002 | Gilbert | 330/284 |
| 6,525,601 | B2 |  | 2/2003 | Gilbert | 327/560 |
| 7,088,179 | B2 |  | 8/2006 | Gilbert et al. |  |

OTHER PUBLICATIONS

Roubik Gregorian, *Introduction to CMOS OP-AMPS and Comparators*, 1999, pp. 100-106, 140-148.

* cited by examiner

*Primary Examiner*—Khanh Van Nguyen
(74) *Attorney, Agent, or Firm*—Marger Johnson & McCollom, PC (57) ABSTRACT

A selectable-gain amplifier selectively couples different capacitors and feedback networks to a gain stage to provide operating characteristics that may include constant bandwidth operation. An interpolated VGA includes pairs of gm cells with cross-connected outputs and may include output cascodes. A dual-rank interpolator utilizes a correction current with a second-order temperature characteristic which may compensate for temperature effects in the transistor ranks.

23 Claims, 8 Drawing Sheets

AMPLIFIER WITH CAPACITOR SELECTION

This application claims priority from U.S. Provisional Patent Application No. 60/511,208 filed Oct. 14, 2003, which is incorporated by reference.

BACKGROUND

In many situations it is useful for an amplifier to have two different gain settings. For example, if a variable gain amplifier (VGA) is used to drive an analog-to-digital converter (ADC or A/D converter), it may be useful to provide two different gain ranges: a high gain range for driving 10-bit converters, and a low gain range for driving 12-bit converters.

Figure 1:
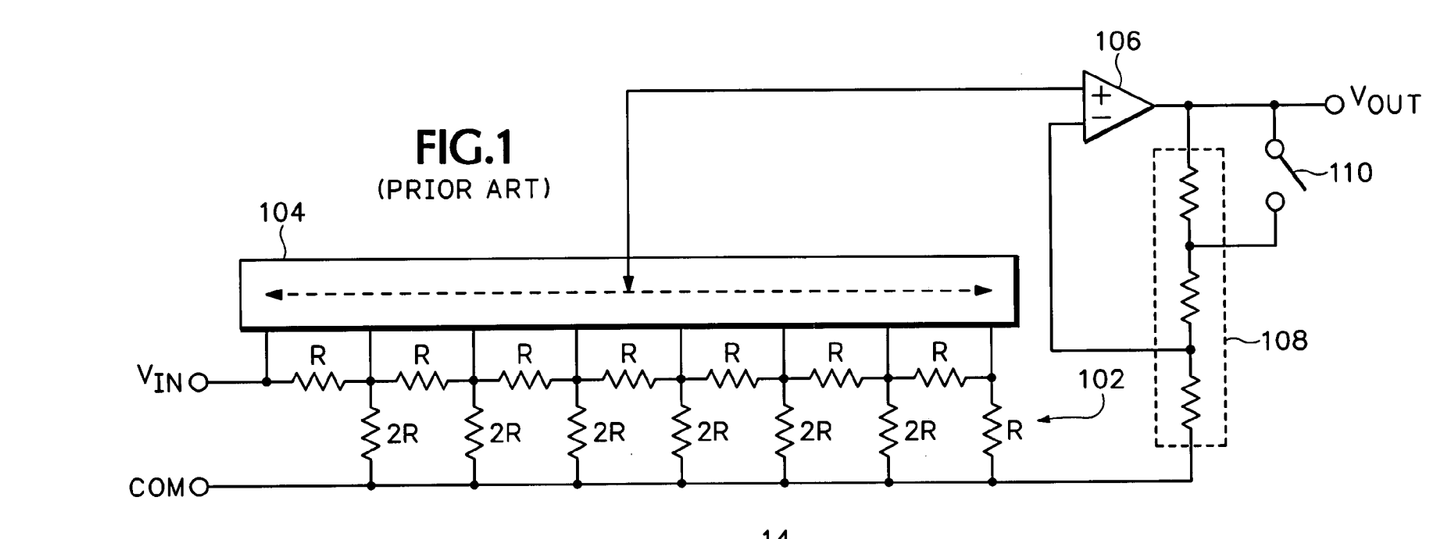
FIG. 1 illustrates a prior art VGA with selectable gain ranges.

FIG. 1 illustrates such an arrangement, which is based on a VGA having a continuously interpolated attenuator. The input signal is applied to an attenuator network 102. Attenuated versions of the input signal are available at tap points along the attenuator. A steering circuit 104, typically based on a series of transconductance (gm) cells controlled by an interpolator, selects the signals from one or more tap points and feeds them to a fixed gain amplifier 106. By selecting various tap points along the attenuator and merging the signals from adjacent tap points, the steering circuit provides continuously variable gain control. A switched feedback network 108 for the fixed gain amplifier allows the user to switch between high and low gain ranges by opening or closing switch 110. This changes the bandwidth in a voltage feedback amplifier with fixed compensation.

DETAILED DESCRIPTION

This patent encompasses multiple inventive principles. For convenience, the various inventions disclosed in this application may sometimes be referred to collectively or individually as "the present invention". It will be understood, however, that these inventions have independent utility and are independently patentable. In some cases, additional benefits are realized when some of the principles are utilized in various combinations with one another, thus giving rise to yet more patentable inventions.

These principles may be realized in numerous different embodiments. Some preferred embodiments are described below. Although some specific details are shown for purposes of illustrating the preferred embodiments, other effective arrangements can be devised in accordance with the inventive principles of this patent. Thus, the inventive principles are not limited to the specific details disclosed herein.

Amplifier With Capacitor Selection

Although the prior art circuit of FIG. 1 provides a workable solution in some situations, it is difficult to implement the switch 110 in many types of integrated circuits (ICs). Another problem with the arrangement of FIG. 1 is that there is a gain-bandwidth tradeoff between the gain ranges. That is, the circuit has a certain bandwidth when operating in the low-gain mode, and a different bandwidth when operating in the high-gain mode.

Figure 2:
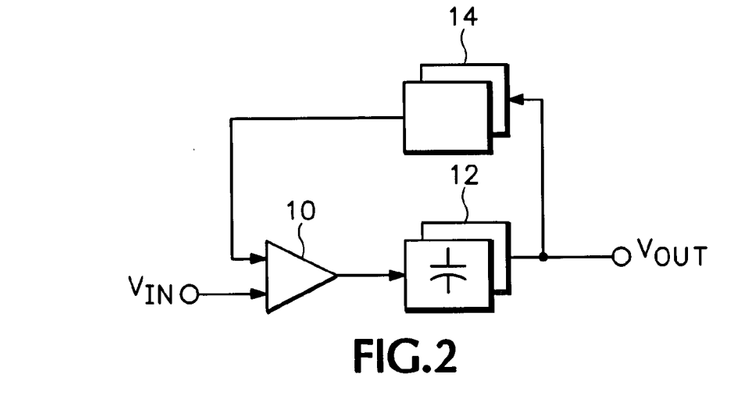
FIG. 2 illustrates an embodiment of a technique for providing selectable gain in accordance with the inventive principles of this patent.

FIG. 2 illustrates an embodiment of a technique for providing selectable gain in accordance with the inventive principles of this patent. The circuit of FIG. 2 includes a gain stage 10 having a first input for receiving an input signal $V_{IN}$, and an output terminal connected to a selectable capacitor circuit 12. An output signal $V_{OUT}$ is taken from the capacitor circuit and fed back to a second input of the gain stage through a selectable feedback network 14.

An advantage of this arrangement is that it may be configured to provide constant bandwidth operation. For example, if the gain stage 10 is implemented as a transconductance (gm) cell, the bandwidth is related to $g_m/(A*C_C)$ where $g_m$ is the transconductance of the cell, A is the gain, and $C_C$ is a compensation capacitance which may be determined by the selectable capacitor circuit 12. Since the gain is related to the feedback factor F as 1/A, which may be determined by the selectable feedback network 14, the bandwidth can alternatively be expressed as $g_m F/C_C$. Thus, as the gain is changed by operation of the selectable feedback network, the bandwidth may be held constant by coordinated operation with the selectable capacitor circuit.

Another advantage is that the embodiment of FIG. 2 may also be configured to provide constant input-referred noise where the $g_m$ is not changed to maintain constant bandwidth.

Yet another advantage of the embodiment of FIG. 2 is that it may be configured for constant power consumption. For example, if the gain stage is implemented as a transconductance cell, the $g_m$ of the cell may remain fixed. Since $g_m$ is typically determined by bias current, the bias current, and thus, power consumption may remain constant. This is in contrast to alternative designs that might try to maintain constant bandwidth by varying $g_m$ instead of $C_C$. Attempts to vary the $g_m$ of a transconductance cell typically require variations in bias current or resistor values, either of which cause the power consumption and noise to change.

Figure 3:
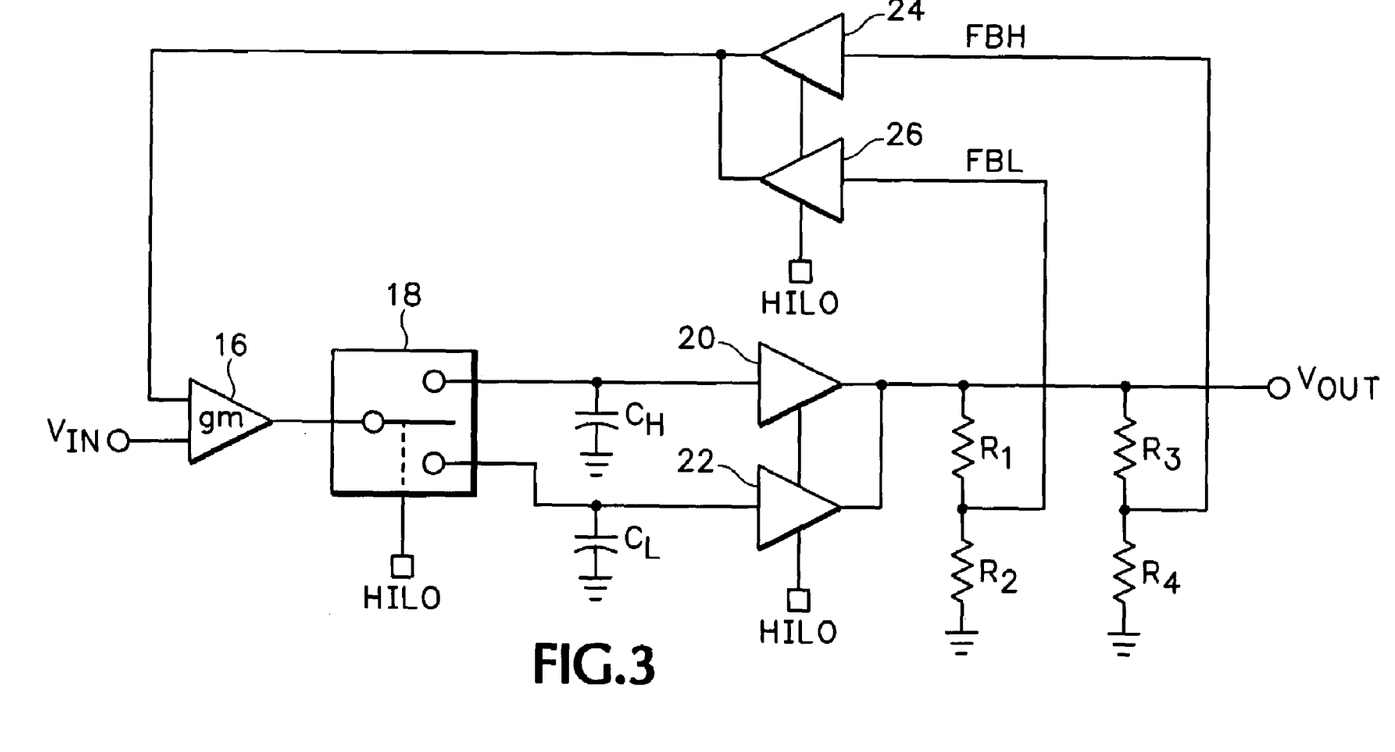
FIG. 3 illustrates a single-sided embodiment of a selectable gain amplifier according to the inventive principles of this patent.

FIG. 3 illustrates some example implementation details of a single-sided embodiment of a selectable gain amplifier according to the inventive principles of this patent. In the circuit of FIG. 3, the gain stage is implemented as a gm cell 16. The selectable capacitor circuit includes a switch circuit 18 that directs the output from the gm cell to either of compensation capacitors $C_H$ or $C_L$ responsive to a gain select signal HILO. A pair of selectable buffers 20 and 22 provides the output signal $V_{OUT}$ by buffering the signal from one of the capacitors in response to HILO. The output signal $V_{OUT}$ is also applied to a pair of resistive attenuators R1,R2 and R3,R4 which, together with buffers 24 and 26, form the selectable feedback network. The gain select signal HILO selectively enables the correct output 20 and 22 and the corresponding buffer 24 or 26 to couple one of the feedback signals FBH or FBL back to the gm cell.

By proper selection of capacitor and feedback values, the circuit of FIG. 3 may be implemented to provide constant bandwidth operation regardless of gain setting. Limitless variations to this embodiment are contemplated in accordance with the inventive principles. For example, the switch circuit may be implemented with simple CMOS switches, but it may alternatively be implemented with a folded cascode arrangement or transistors if CMOS switches are not available. Depending on the impedance requirements for various signals, the buffers may be implemented as simple switches. As a further example, the embodiment of FIG. 3 is illustrated with two gain settings, but any number of gain settings is possible in accordance with the inventive principles.

Another advantage of a selectable gain amplifier according to the inventive principles of this patent is that it may be implemented as a VGA, especially of the continuously interpolated type, in a synergistic manner so as to create a robust and versatile system, directly applicable to numerous systems, and suited to implementation in monolithic integrated circuit form. An example embodiment of such a system will now be described with reference to FIG. 4.

Figure 4:
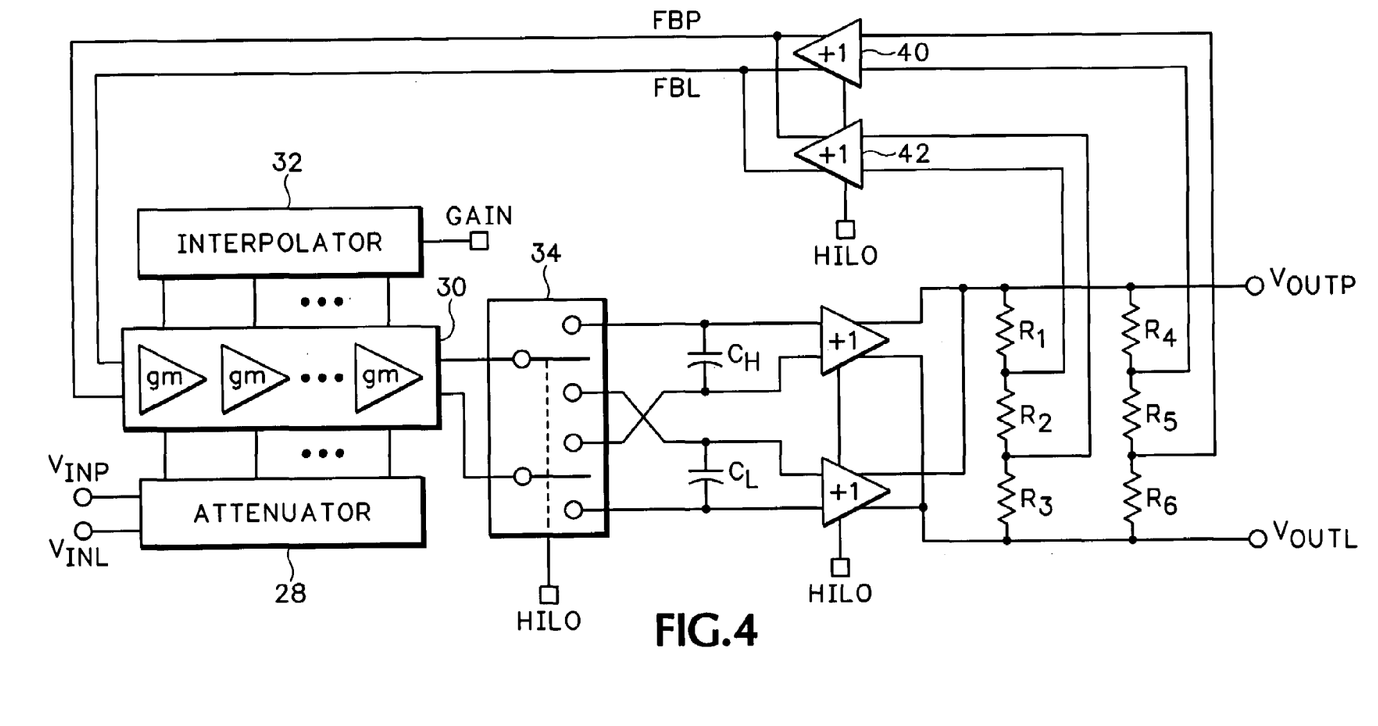
FIG. 4 illustrates an embodiment of a selectable gain amplifier having a continuously interpolated VGA gain stage according to the inventive principles of this patent.

In the embodiment of FIG. 4, the gain stage is realized as a VGA having a continuously interpolated attenuator. An example of one such VGA has already been shown in FIG. 1 and is described in more detail in U.S. Pat. No. 5,077,541. Some commercial embodiments are sold under the trademark X-AMP®. Numerous variations of, and improvements to, this architecture have been disclosed and patented, for example, U.S. Pat. No. 5,684,431 discloses an arrangement having a differential architecture, some commercial embodiments of which are sold under the trademark DSX-AMP™. U.S. Pat. No. 6,525,601 B2 discloses another arrangement having transconductance stages with feedforward paths diverted to AC ground. Any of these continuously interpolated VGAs are suitable for use with the embodiment of FIG. 4, as are many others. Therefore, the VGA is shown somewhat generically as having an attenuator 28 and a steering circuit that includes an input system 30 and an interpolator 32. The interpolator causes the input system to select from one or more of the attenuator tap points in response to a gain control signal GAIN. The VGA preferably has an input system based on a series of gm cells and a fully differential signal path as shown in FIG. 4.

The remainder of the circuit of FIG. 4 is similar to that of FIG. 3 but continues with a fully differential signal path throughout to maximize signal swing and reduce even order distortion. In operation, the high or low gain range is selected by the HILO signal which causes only one of the feedback paths, output stages and feedback buffers to be selected at a time. Within any one of the gain ranges, the VGA can swing through its entire operating range in response to the GAIN signal.

By implementing the input system of the VGA as a series of gm cells, the input stage portion of the selectable gain amplifier is integrated directly into the VGA, thereby providing both the variable gain and selectable gain range functions in a tightly integrated system. Although both of these functions could be obtained by coupling a separate, complete VGA to the input of either of the selectable gain embodiments of FIGS. 2 or 3, this may reduce the overall bandwidth, increase power consumption, and possibly result in instability due to another pole being introduced into the signal chain. In contrast, the embodiment of FIG. 4 has only a single-pole response and may provide improved stability.

Figure 5:
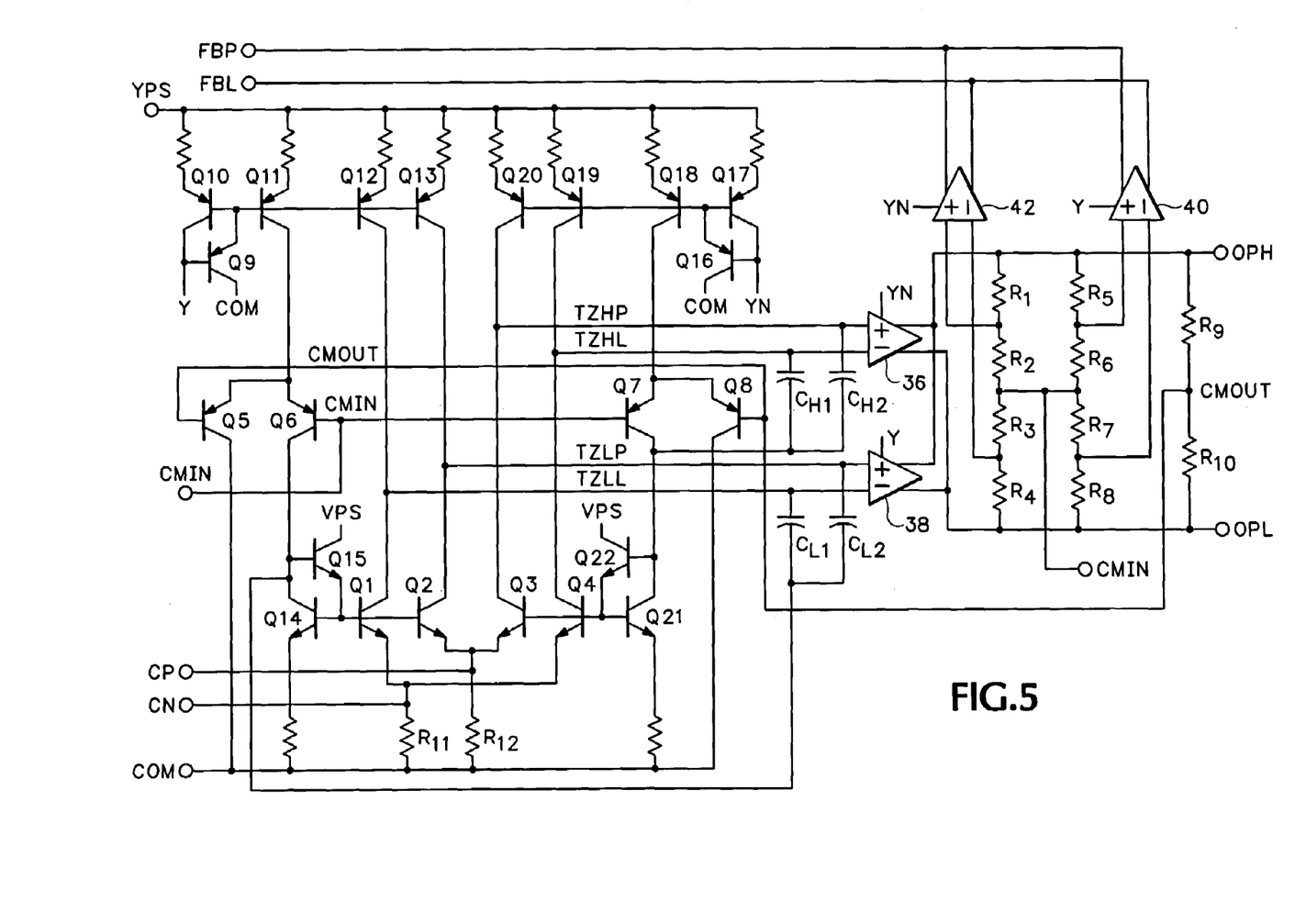
FIG. 5 illustrates a selectable gain amplifier having a folded cascode switch circuit according to the inventive principles of this patent.

FIG. 5 illustrates some preferred implementation details of a portion of the embodiment of FIG. 4. The switch circuit is implemented as two separate folded-cascode arrangements that can be independently enabled or disabled in response to the complementary gain select signals Y and YN. When low gain mode is selected (that is, when Y is asserted, and YN is disabled), cascode transistors Q1 and Q2 are enabled. The differential output current signal CP,CN from the VGA section is applied to Q1 and Q2 which drive capacitors $C_{L1}$ and $C_{L2}$. Buffer amplifier 38, which is also enabled by Y, provides the final output signal as OPH and OPL. Although the final output signal is applied to both feedback attenuators R1–R4 and R5–R8, only buffer amplifier 40 is enabled, so the output signal is attenuated by a factor determined by R5–R8 and fed back to the VGA section as the feedback signal FBP and FBL. In this mode, the bandwidth is determined by the values of $C_{L1}, C_{L2}$ and R5–R8 (as well, of course, as the $g_m$ of the VGA or other gain stage that is providing the input signal CP,CN).

In high gain mode (when Y is disabled and YN is asserted), cascode transistors Q3 and Q4 are enabled, as are buffer amplifier 36 and feedback amplifier 42. The feedback factor is determined by R1–R4, and the bandwidth is determined by the values of $C_{H1}, C_{H2}$ and R1–R4.

Cascode transistors Q1 and Q2 are biased by a multiple-output current mirror including transistors Q9–Q13 which can be enabled or disabled by the gain select signal Y. Two of the current mirror outputs provide bias currents directly to Q1 and Q2 which then flow to the ground node COM through R11 and R12. Another output from the current mirror biases transistor Q14 which, with the help of Q15, establishes a reference point for the bases of Q1 and Q2.

Transistor Q6, which is interposed between the current mirror and Q14, is part of a common-mode loop that centers the output signal at a midpoint that is determined by an input common-mode reference signal CMIN. Transistors Q5 and Q6 are arranged so that a portion of the bias current from the current mirror flows to Q14 through Q6, and the remainder is diverted to ground through Q5. The amount of current diverted depends on the differential voltage at the bases of Q5 and Q6, which receive the signals CMIN and CMOUT, respectively. When the loop is balanced, CMIN=CMOUT, and half of the current from Q11 flows in each of Q5 and Q6. CMOUT is an output common mode voltage signal that is obtained from the center tap of a resistor divider R9,R10 which receives the final output signal OPH and OPL. By diverting more or less current to ground, transistors Q5 and Q6 modulate the reference voltage at the bases of Q1 and Q2, thereby servoing the common mode loop and maintaining the midpoint of the output signal at CMIN. The signal CMIN is also applied to a center tap of the feedback attenuators R1–R4 and R5–R8. The center point of capacitors $C_{L1}$ and $C_{L2}$ is anchored one $V_{BE}$ above the bases of Q1 and Q2 and represents the common-mode compensation point. The value of $C_{L1}+C_{L2}$ is the capacitance value that compensates the common-mode loop while $(C_{L1}+C_{L2})/2$ is the capacitance value that compensates the differential signal.

The other folded-cascode arrangement including cascode transistors Q3 and Q4 is enabled and biased by another multiple-output current mirror formed from transistors Q16–Q20. This mirror can be enabled or disabled by the complementary gain select signal YN. Two of the mirror outputs bias Q3 and Q4, and another output biases transistor Q21 which establishes a reference point for the bases of Q3 and Q4 with the help of Q22. Transistors Q7 and Q8 complete the common-mode loop for this half of the switch circuit and operate in the same manner as Q5 and Q6 on the other half.

Continuously Interpolated VGAs With Cross-Connected Gm Cells

Figure 6:
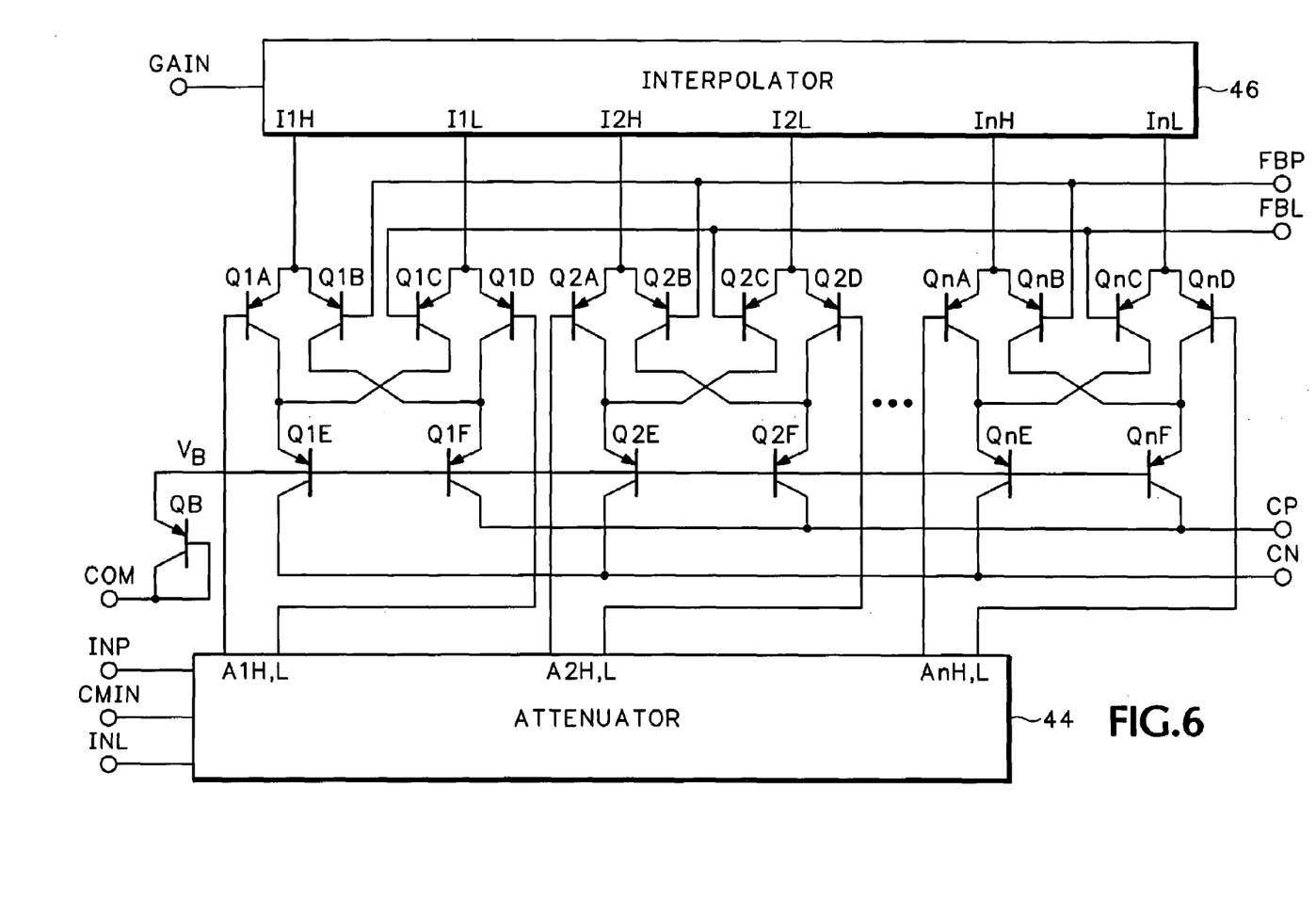
FIG. 6 illustrates an embodiment of an interpolated VGA having pairs of gm cells with cross-connected outputs and cascodes according to the inventive principles of this patent.

FIG. 6 illustrates some additional inventive principles of this patent which relate to improvements to continuously interpolated VGAs. For convenience, these principles will be described in the context of refinements to the VGA shown in FIG. 4. However, these additional inventive principles have independent utility and are not limited to the specific embodiments or applications described here.

The circuit of FIG. 6 includes an attenuator 44 having tap points which, in this example, have pairs of differential outputs A1H and A1L, A2H and A2L, etc. If the attenuator has a midpoint node, it may be anchored to a common mode reference signal such as CMIN. This node provides bias to the input devices. The circuit also includes pairs of gm cells Q1A–Q1D, Q2A–Q2D, etc. The gm cell pairs are controlled by pairs of interpolator currents I1H and I1L, I2H and I2L, etc. from interpolator 46. Although the specific type of interpolator is not critical, a dual-rank, spatially amplifying interpolator like those disclosed in U.S. Pat. No. 6,489,849 is particularly well-suited to this application.

One gm cell in each pair has one of its inputs connected to receive one side of a corresponding attenuator output pair and its other input connected to receive one side of the feedback signal. The other gm cell in each pair has one of its inputs connected to receive the other side of the attenuator output pair and its other input connected to receive the other side of the feedback signal. Thus, for example, the bases of Q1A and Q1B are connected to A1H and FBP, respectively, while the bases of Q1C and Q1D are connected to FBL and A1L, respectively. The common emitter node of Q1A and Q1B receive the interpolator signal I1H, and the common emitter node of Q1C and Q1D receive the interpolator signal I1L.

The outputs from the pairs of gm cells are cross-connected and then fed to corresponding pairs of cascode transistors Q1E and Q1F, Q2E and Q2F, etc. before being combined to produce the differential output signal CP,CN. For example, the collectors of Q1A and Q1C are connected to the emitter of Q1E, while the collectors of Q1B and Q1D are connected to the emitters of Q1F. Transistor QB establishes a reference signal $V_B$ for the bases of the cascode transistors.

Cross-connecting the outputs from the gm cells provides common-mode rejection from the input and feedback nodes. The attenuator preferably has a midpoint node anchored to the common-mode reference signal CMIN, which is preferably derived from the common-mode level of any preamplifier or signal source that may be driving the attenuator inputs INP,INL. This type of input stage has good common-mode rejection, but it reduces the amount of differential mode input range as the common-mode level of the input signal either increases or decreases. Therefore, it is preferable that the CMIN node is at the same common-mode level as the amplifier driving the VGA.

The cascode transistor pairs reduce AC feedthrough at low gains. Without the cascodes, the signal fed through the base-collector junction capacitances $C_{JCS}$ in the gm stages near the input pins INP and INL could be larger than the attenuated signal at the other end of the attenuator.

Interpolator Having Supply Current With Second-Order Temperature Effect

Some additional inventive principles of this patent relate to improvements to interpolators having dual transistor ranks. An interpolator constructed according to the inventive principles of this patent may be utilized in the VGA systems shown in FIGS. 4 and 6. However, these additional inventive principles relating to interpolators have independent utility and are not limited to the specific embodiments or applications described here.

A type of interpolator having dual-ranks of transistors arranged for spatial amplification is disclosed in U.S. Pat. No. 6,489,849. This type of interpolator has a first rank of transistors that generate a series of partially switched currents. A second rank of transistors generate the final interpolator currents by spatially amplifying the partially switched currents. Since transistors typically suffer from temperature-dependent effects, an interpolator having dual transistor ranks may introduce unwanted temperature dependencies in both ranks.

Figure 7:
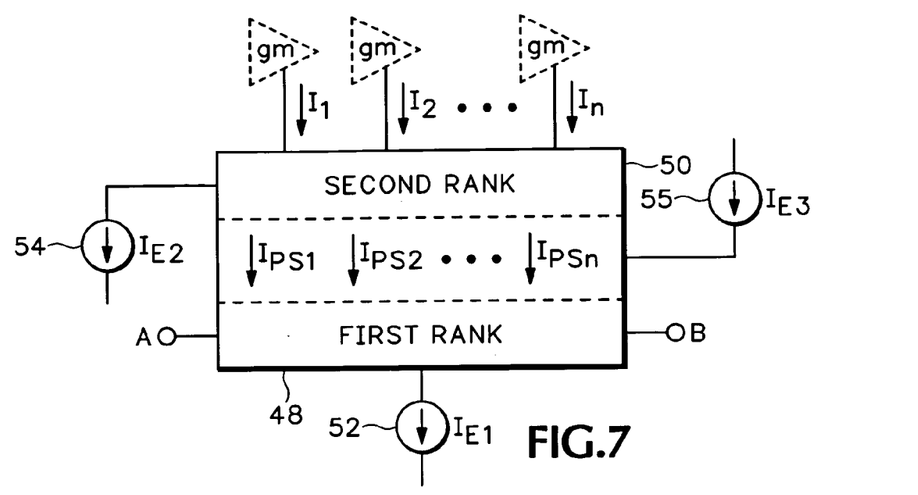
FIG. 7 illustrates an embodiment of an interpolator according to the inventive principles of this patent.

An embodiment of an interpolator capable of correcting temperature-dependent effects according to the inventive principles of this patent is illustrated in FIG. 7. The interpolator shown in FIG. 7 includes a first rank of transistors 48 arranged to generate a series of partially switched currents $I_{PS1}, I_{PS2}, \ldots I_{PSn}$ from a current $I_{E1}$ (which is generated by current source 52) in response to a control signal applied to terminals A and B. The partially switched currents are applied to a second rank of transistors 50 which spatially amplify the partially switched currents, typically by steering a supply current such as $I_{E2}$ to one or more outputs I1, I2, . . . In. By way of example, the final interpolator currents are shown driving gm stages, but an interpolator constructed according to the inventive principles of this patent may be used in any other application as well.

To correct for some temperature-dependent effects in the two transistor ranks, a correction current source 55 generates a correction current $I_{E3}$ with a second-order temperature characteristic. This correction current $I_{E3}$ may be coupled to the interpolator and arranged to compensate for temperature dependencies in the first and second ranks of transistors. For example, if the first and second ranks of transistors are implemented with bipolar junction transistors (BJTs), the correction current source 55 may generate the correction current $I_{E3}$ so that it has a square law relation to absolute temperature (PTAT squared) so as to compensate for the combined temperature behavior which is proportional to absolute temperature (PTAT) in each rank. As used herein, second-order refers not only to a square-law characteristic, but also to any other mathematical relationship that corrects for the compounding or multiplying of temperature effects caused by two ranks of transistors, as well as approximations thereof.

Figure 8:
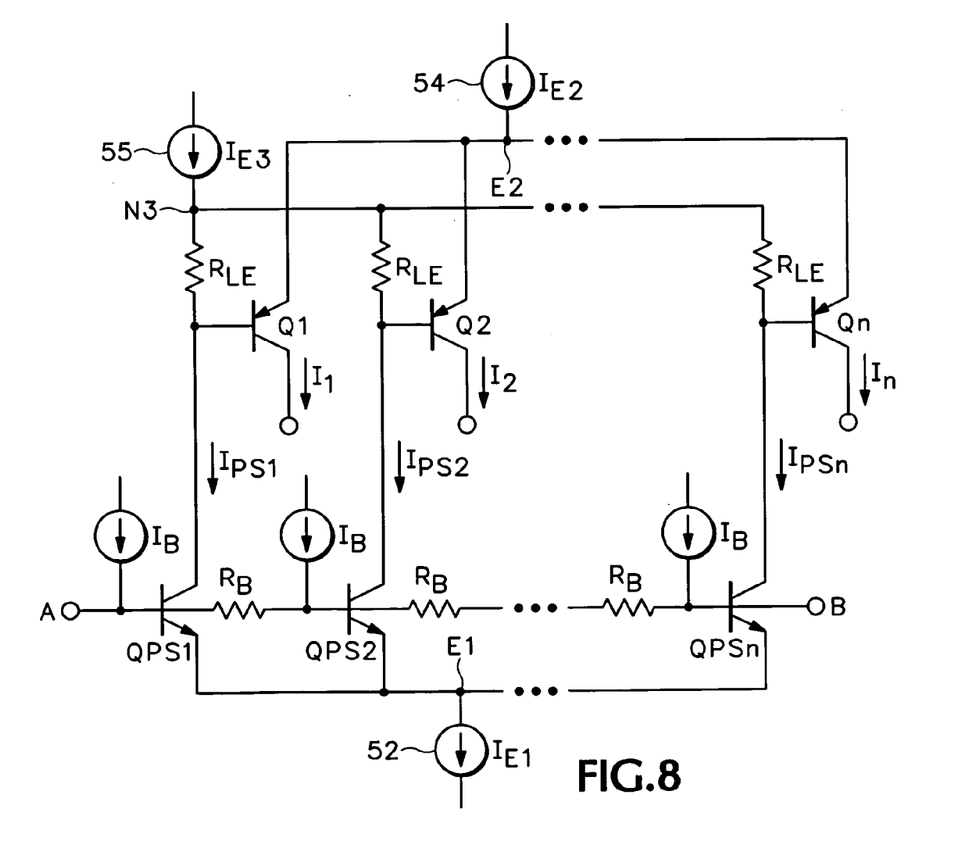
FIG. 8 illustrates another embodiment of an interpolator according to the inventive principles of this patent.

FIG. 8 illustrates another embodiment of an interpolator according to the inventive principles of this patent. In the embodiment of FIG. 8, the first rank is implemented as a series of NPN transistors QPS1, QPS2, . . . QPSn having a common emitter connection at node E1 which receives the supply current $I_{E1}$ from current source 52. A string of base resistors $R_B$ connects the bases of adjacent transistors. The base of each transistor receives a separate current $I_B$ from one of a series of current sources. A control signal is applied as a voltage $V_{AB}$ across terminals A and B which are connected to the bases of the outer transistors.

The second rank is implemented as PNP transistors Q1, Q2, . . . Qn which have their emitters connected together at a common emitter node E2. A second current source 54 provides a second supply current $I_{E2}$ to node E2. The partially switched currents $I_{PS1}, I_{PS2}, \ldots I_{PSn}$, which are generated at the collectors of QPS1, QPS2, . . . QPSn, are applied to the bases of corresponding transistors Q1, Q2, . . . Qn in the second rank. The base of each second rank transistor is connected to a correction current source 55 at node N3 through one of the resistors $R_{LE}$. Thus, node N3 is a relatively high-impedance node. The final interpolator currents I1, I2, . . . In are generated at the collectors of Q1, Q2, . . . Qn and may be used to drive, for example, the input gm cells of an interpolated VGA.

For a pair of emitter-coupled transistors such as QPS1 and QPS2 in FIG. 8, the ratio of collector currents has a first-order temperature dependency given by:

$$\Delta V_{BE} = V_T \ln A = \frac{kT}{q} \ln\left(\frac{I_{PS1}}{I_{PS2}}\right) \qquad \text{Eq. 1}$$

where $\Delta V_{BE}$ is the difference between the base voltages of QPS1 and QPS2, A is the ratio of collector currents, and $V_T$ is the thermal voltage which can also be expressed as kT/q where T is absolute temperature.

If the control signal $V_{AB}$ is a temperature-stable signal (sometimes referred to as a ZTAT signal where the Z stands for zero temperature coefficient), then the differential base voltages between adjacent transistors, which appear across the base resistors $R_B$, will also be temperature stable. Therefore, the ratios of partially switched currents will vary exponentially in inverse proportion to absolute temperature. Since the second rank of transistors imparts another first-order temperature dependency on the system, the final output currents have an inverse second-order temperature dependency.

Therefore, the current source 55 is designed to impose a second-order temperature characteristic on the correction current $I_{E3}$. In this example, the correction current is made to vary according to the second power of absolute temperature so that it may cancel the inverse temperature effects of the two transistor ranks. This may provide an easily designable system with temperature-stable outputs and reduces or eliminates the need for trial-and-error type fine-tuning through simulation.

Figure 9:
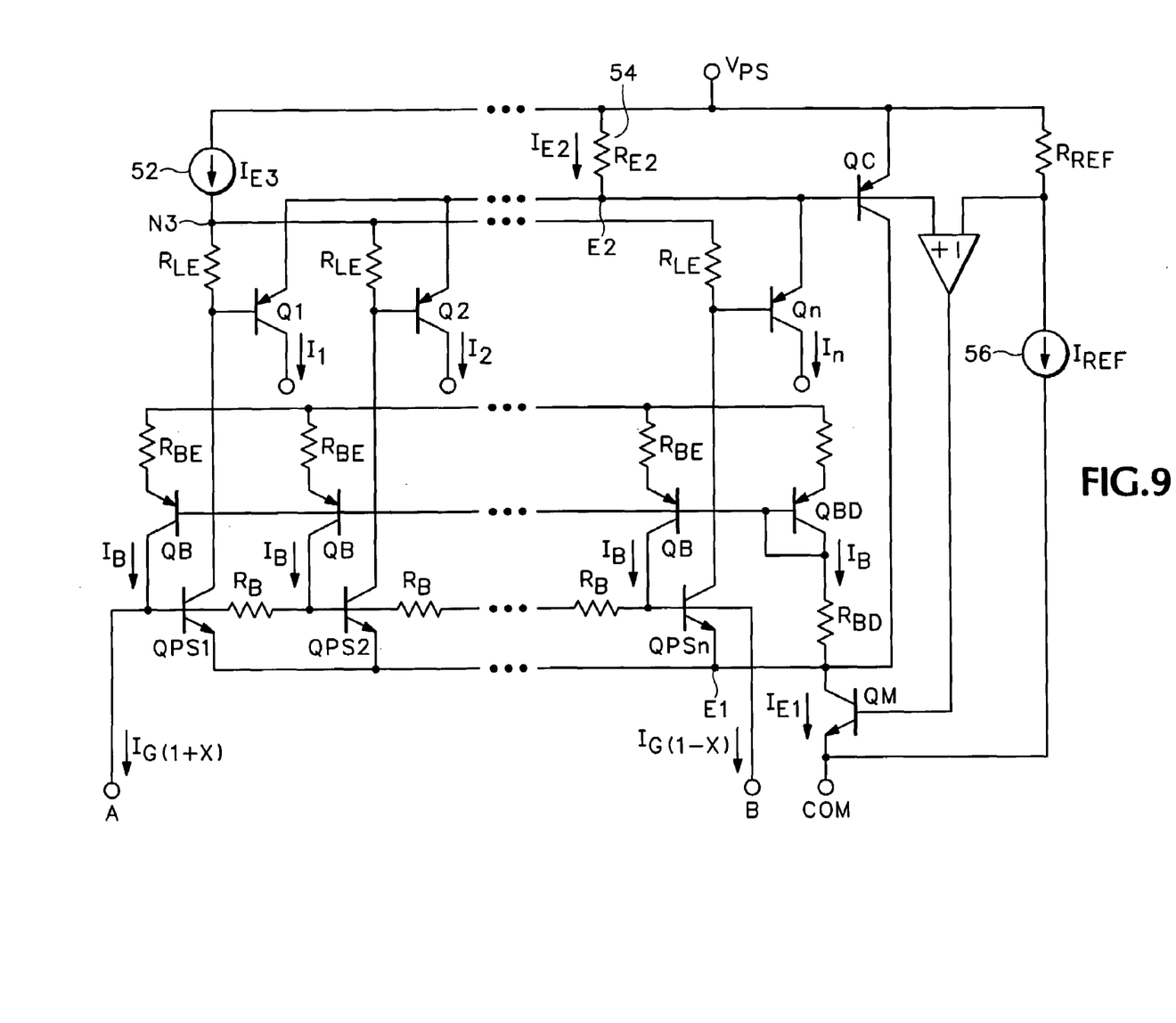
FIG. 9 illustrates another embodiment of an interpolator according to the inventive principles of this patent.

FIG. 9 illustrates another embodiment of an interpolator according to the inventive principles of this patent. In the embodiment of FIG. 9, the first and second ranks of transistors are arranged in much the same manner as the circuit of FIG. 8. This arrangement allows a transistor QM to be connected to node E1 to implement $I_{E1}$ in a servo arrangement that may provide additional benefits as discussed below.

The currents $I_B$ for the first rank of transistors are provided by a multiple-output current mirror including a diode-connect transistor QBD and a series of transistors QB that replicate the current $I_B$ which is established through QBD by resistor $R_{BD}$. Transistor QM absorbs the current $I_B$ through transistor QBD as well as the correction current $I_{E3}$. In this example, the interpolator may be controlled by a ratiometric drive circuit that drives the terminals A and B with currents $I_G(1+X)$ and $I_G(1-X)$, respectively, where X is a modulation factor that varies between −1 and +1 as described in U.S. Pat. No. 6,489,849.

The second supply current source is implemented here as a resistor $R_{E2}$ connected between node E2 and a power supply $V_{PS}$. Another current source 56 sets up a reference current $I_{REF}$ in a resistor $R_{REF}$. An operational amplifier (op amp) is arranged to sense the voltages across $R_{E2}$ and $R_{REF}$ and drive the base of QM so as to servo the entire system, thereby regulating the current $I_{E2}$ based on the reference current $I_{REF}$. The reference current $I_{REF}$ may be given any desired temperature characteristic. For example, if the interpolator output currents I1, I2, . . . In will be used to control gm cells in an interpolated VGA, $I_{REF}$ may be implemented as a PTAT current, in which case the interpolator currents will vary in proportion to absolute temperature, thereby maintaining constant $g_m$ in the gm cells.

If needed, a clamp transistor QC may have its emitter connected to VPS, its base connected to node E2, and its collector connected to node E1 to ensure the system will settle in to a proper operating point.

Figure 10:
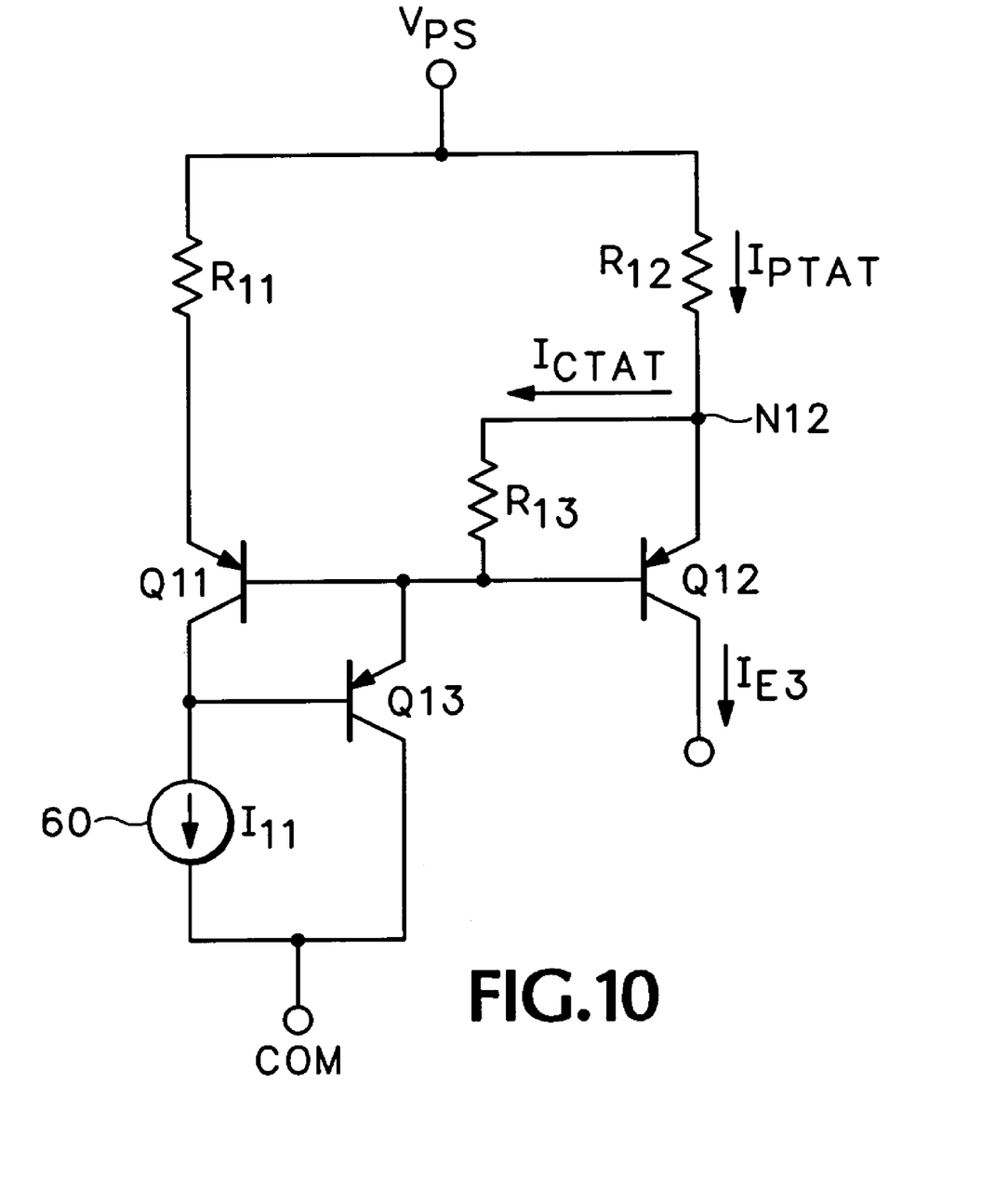
FIG. 10 illustrates an embodiment of a current source having a second-order temperature characteristic according to the inventive principles of this patent.

FIG. 10 illustrates an embodiment of a current generator capable of generating a correction current having a second-order temperature characteristic according to the inventive principles of this patent. The circuit of FIG. 10 includes transistors Q11 and Q12 arranged in a current mirror configuration with emitter resistors $R_{11}$ and $R_{12}$, respectively. Transistor Q11 is arranged as the diode-connected transistor and assisted by a current gain transistor Q13. A current source 60 establishes a PTAT reference current $I_{11}$ through Q11, which in turn, establishes a PTAT current $I_{PTAT}$ through $R_{12}$. Since the $V_{BE}$ of Q12 is complementary to absolute temperature (CTAT), it can be used to force a CTAT current $I_{CTAT}$ in resistor $R_{13}$ which is connected across the base-emitter junction of Q12. Thus, at node N12, a CTAT current is subtracted from a PTAT current to generate a type of super-PTAT current through the collector of Q12 (ignoring base current) that approximates a second-order temperature characteristic. This characteristic may be used as the second-order effect in the correction current $I_{E3}$ shown in FIGS. 8 or 9.

Some of the embodiments disclosed in this patent application have been described with specific signals implemented as current-mode or voltage mode signals, but the inventive principles also contemplate other types of signals, whether characterized as voltages, currents, or otherwise. For example, signals having a second-order temperature characteristic have been shown generally as currents, but they may also be implemented as voltage signals. Likewise, some semiconductor devices are described as being specifically NPN or PNP bipolar junction (BJT) type transistors, but other types of devices may be utilized. For example, although some example embodiments of interpolators have been illustrated with BJT transistors, interpolators may be constructed with MOS or other types of transistors in accordance with the inventive principles of this patent. And although some of the specific circuit topologies have been shown for purposes of illustrating the preferred embodiments, numerous other structures are possible, and yet others can be devised in accordance with the inventive principles of this patent.

Thus, the embodiments described herein can be modified in arrangement and detail without departing from the inventive concepts. Accordingly, such changes and modifications are considered to fall within the scope of the following claims.

The invention claimed is:

1. An amplifier comprising:
   a gain stage having a first input for receiving an input signal;
   a selectable capacitor circuit comprising a plurality of capacitors having different values and coupled to an output of the gain stage; and
   a selectable feedback network coupled between the selectable capacitor circuit and a second input of the gain stage to set the gain of the amplifier by providing one of a plurality of different feedback factors in response to a gain select signal;
   wherein the selectable capacitor circuit is configured to provide frequency compensation to the amplifier by selecting one of the capacitors corresponding to a selected one of the feedback factors in response to the gain select signal.

2. An amplifier according to claim 1 wherein a switch circuit is coupled between the gain stage and the plurality of capacitors.

3. An amplifier according to claim 2 wherein the selectable capacitor circuit further comprises a plurality of selectable buffers coupled between the plurality of capacitors and the selectable feedback network.

4. An amplifier according to claim 2 wherein the switch circuit comprises a folded cascode circuit.

5. An amplifier according to claim 1 wherein the selectable feedback circuit comprises a plurality of attenuators.

6. An amplifier according to claim 5 wherein the selectable feedback circuit further comprises a plurality of selectable buffers coupled between the plurality of attenuators and the gain stage.

7. An amplifier according to claim 1 wherein the gain stage comprises a gm cell.

8. An amplifier according to claim 1 wherein the gain stage comprises a VGA.

9. An amplifier according to claim 8 wherein the VGA comprises a continuously interpolated amplifier.

10. An amplifier according to claim 1 wherein:
    the selectable capacitor circuit further comprises a switch circuit coupled between the gain stage and the plurality of capacitors, and a plurality of selectable buffers coupled between the plurality of capacitors and the selectable feedback network;
    the selectable feedback circuit comprises a plurality of attenuators and a plurality of selectable buffers coupled between the plurality of attenuators and the gain stage; and
    the gain stage comprises a continuously interpolated amplifier.

11. An amplifier according to claim 9 wherein the VGA includes an input system comprising:
    an attenuator having a plurality of tap ports; and
    a plurality of pairs of gm cells, each pair of gm cells coupled to one of the tap ports;
    wherein each pair of gm cells has cross-connected outputs.

12. An amplifier according to claim 11, the input system further comprising a plurality of cascode cells coupled to the plurality of gm cells.

13. An amplifier according to claim 9 wherein the VGA includes an interpolator comprising:
    a first rank of transistors to generate a plurality of partially switched currents responsive to a control signal;
    a second rank of transistors coupled to the first rank of transistors to spatially amplify the partially switched currents, thereby generating a plurality of interpolator currents; and
    a signal source having a second-order temperature characteristic and arranged to compensate for temperature dependencies in the first and second ranks of transistors.

14. An amplifier according to claim 13 wherein:
    the first and second ranks of transistors comprise bipolar-junction transistors; and
    the signal source comprises a current source designed to generate a current that varies according to a square of absolute temperature.

15. An amplifier according to claim 14 wherein the current source is designed to approximate a square-law temperature characteristic in the supply current with a super-PTAT type temperature characteristic.

16. An amplifier according to claim 15 wherein the current source is designed to generate a super-PTAT type temperature characteristic by subtracting a CTAT current from a PTAT current.

17. An amplifier according to claim 13 wherein:
    the first rank of transistors is arranged to generate the plurality of partially switched currents responsive to a first supply current;
    the second rank of transistors is arranged to generate the plurality of interpolator currents responsive to a second supply current; and
    the signal source comprises a current source coupled to the first or second rank of transistors to provide a correction current having a second-order temperature characteristic thereto.

18. The amplifier of claim 1 wherein the capacitor values and feedback factors are selected to provide substantially constant bandwidth operation.

19. The amplifier of claim 1 wherein the gain stage, capacitor circuit and feedback network are configured to provide single pole operation.

20. A method comprising:
    coupling an input signal to a first input of a gain stage;
    selectively coupling a plurality of capacitors having different values to an output of the gain stage;
    selectively coupling a plurality of feedback networks having different feedback factors between the plurality of capacitors and a second input of the gain stage;
    wherein each of the capacitors is configured to provide frequency compensation in coordination with a corresponding one of the feedback networks.

21. A method according to claim 20 wherein the gain stage comprises a VGA.

22. A method according to claim 20 wherein selectively coupling the plurality of capacitors to the output of the gain stage comprises selectively enabling a plurality of folded cascode circuits.

23. A method according to claim 21, wherein the VGA comprises a continuously interpolated amplifier, and further comprising generating a plurality of interpolator currents for the continuously interpolated amplifier by:
    generating a plurality of partially switched currents responsive to a control signal and a correction current;
    spatially amplifying the partially switched currents, thereby generating the interpolator currents; and
    imposing a second-order temperature characteristic on the correction current.

* * * * *